(12) United States Patent
Vaccaro

(10) Patent No.: US 7,972,442 B2
(45) Date of Patent: Jul. 5, 2011

(54) PHOTOPLATE FOR OLED DEPOSITION SCREEN

(75) Inventor: Robert Vaccaro, Greensburg, PA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 191 days.

(21) Appl. No.: 12/216,046

(22) Filed: Jun. 27, 2008

(65) Prior Publication Data

US 2009/0075215 A1     Mar. 19, 2009

Related U.S. Application Data

(60) Provisional application No. 60/958,882, filed on Jul. 9, 2007.

(51) Int. Cl.
*C23C 16/00* (2006.01)

(52) U.S. Cl. .......................................... 118/720; 118/721

(58) Field of Classification Search ..................... 430/5; 313/401–403; 438/166; 349/138; 118/504, 118/720, 721; 204/298.11

See application file for complete search history.

(56) References Cited

U.S. PATENT DOCUMENTS

| | | | |
|---|---|---|---|
| 4,528,246 A | 7/1985 | Higashinakagawa et al. | |
| 5,280,215 A * | 1/1994 | Ohtake et al. | 313/403 |
| 5,396,146 A | 3/1995 | Nakamura et al. | |
| 6,033,766 A * | 3/2000 | Block et al. | 428/210 |
| 6,194,104 B1 * | 2/2001 | Hsu | 430/5 |
| 6,229,255 B1 | 5/2001 | Kim et al. | |
| 6,306,229 B1 | 10/2001 | Ide et al. | |
| 6,858,355 B2 * | 2/2005 | Wang et al. | 430/5 |

FOREIGN PATENT DOCUMENTS

| | | |
|---|---|---|
| JP | 62-290828 | 12/1987 |
| JP | 02-050919 | 2/1990 |
| JP | 02-117703 | 5/1990 |
| JP | 2000-256747 | 9/2000 |

* cited by examiner

*Primary Examiner* — Mark F Huff
*Assistant Examiner* — Stewart A Fraser
(74) *Attorney, Agent, or Firm* — Rader, Fishman & Grauer PLLC

(57) ABSTRACT

A photoplate for manufacturing a deposition mask that is used to form a matrix of pixel areas used in a display panel. The photoplate comprises a layer of material such as quartz, on which a matrix of pixel etching areas is defined. The pixel etching areas are configured to form pixel areas having a specified separation from each other in a vertical direction. The pixel etching areas on the photoplate include an outer periphery having a generally rectangular shape with elongated corners.

5 Claims, 4 Drawing Sheets

PHOTOPLATE FOR OLED DEPOSITION SCREEN

CROSS REFERENCE TO RELATED APPLICATIONS

This application claims priority to previously filed U.S. provisional application Ser. No. 60/958,882, filed on Jul. 9, 2007 and entitled "Dimensional Stabilization of Precision Etched Masks and Photo Plate for OLED Deposition Screen," the entire contents of which are incorporated herein by reference.

This application is also related to U.S. application Ser. No. 12/216,047, entitled "Dimensional Stabilization of Precision Etched Masks," filed on Jun. 27, 2008, the entire contents of which are incorporated by reference.

BACKGROUND OF THE INVENTION

1. Field of the Invention

This invention relates generally to a deposition mask or screen, and more particularly to a photoplate for fabricating an OLED deposition screen.

2. Description of the Related Art

The production of Organic Light Emitting Diode (OLED) televisions and other display panels provides many new challenges. One such challenge is deposition of the thin organic material onto the TFT substrate. It is preferable to maximize the coverage area of the pixel relative to the overall area of the picture, which is accommodated by having rectangular pixels with sharp corners.

Organic materials are routinely thermally evaporated and deposited on a cooled substrate through a deposition mask. In the past this mask has been made of electro-deposited nickel. As screen size increases from the current relatively small diagonal (~3") used in point and shoot cameras to home displays ranging from 28" to 70" or more, the use of an electro-deposited nickel mask provides many processing challenges, many of which are related to the thermal expansion of the material.

Precision metal masks are used in the manufacturing process of making some information displays including Cathode Ray Tubes (CRTs) and OLED displays. Recent increases in screen resolution and sizes are pushing the mask specifications beyond the current capabilities of metal mask production technologies.

One example is the mask needed for depositing material onto a substrate in the production of small molecule OLED screens. The substrate glass has thin film transistors already in place and the OLED material must be deposited in the precise locations on the glass. The positional tolerance of the holes in the deposition mask must meet the requirements after mask manufacturing and during the deposition process.

One way to make metal deposition masks is to chemically etch the holes. This requires several steps to be performed on the metal including cleaning, photoresist coating, imaging, photoresist developing, acid etching, curing substrate protective coating, and resist stripping. These steps cause the mask to be heated and cooled several times during the process. The mask also gets thermally cycled during the process of depositing the organic material onto the substrate.

What is needed are mask designs that accommodate the tolerances and designs required for newer displays, and masks that are dimensionally stable when they are made and in the manufacturing of OLED display screens.

SUMMARY OF THE INVENTION

According to one aspect, the present invention provides a photoplate for manufacturing a deposition mask that is used to form a matrix of pixel areas used in a display panel. The photoplate comprises a layer of material such as quartz, on which a matrix of pixel etching areas is defined. The pixel etching areas are configured to form pixel areas on a mask according to a specified separation from each other in a vertical direction. The pixel etching areas on the photoplate include an outer periphery having a generally rectangular shape with elongated corners. The photoplate, configured as such, accommodates an enhanced etch in the corner areas of formed pixel areas on a mask fabricated using the photoplate.

By way of example, the elongated corner may have an extent of elongation that is approximately one half the specified separation in the vertical direction. The extent of elongation in the horizontal direction may also be approximately one half the specified separation.

According to another aspect, the pixel etching areas may include a plurality of rectangular areas defined within the outer periphery. For example, a first set of the plurality of rectangular areas may have a first area, and a second set of the plurality of rectangular areas may have a second area that differs from the first area.

A subset of the plurality of rectangular areas may also reside closer to the outer periphery and be configured larger than another subset of the plurality of rectangular areas, thereby accommodating an enhanced etch along the sides of formed pixels.

According to still another aspect, dimensional stabilization of a precision etched mask used in the production of organic light emitting diode display panels is provided. This may entail securing a sheet of mask material, and then heating the sheet of mask material to a temperature within a predetermined range for a predetermined amount of time to produce a treated sheet of mask material. The treated sheet of mask material may then be used to fabricate a dimensionally stable precision etched mask, such as by exposing and etching the treated sheet of mask material.

Securing the sheet of mask material may be done according to a tension that accommodates thermal expansion of the sheet of mask material during the heating step, such as spring-tension to hold the mask material in a frame.

In one embodiment, the predetermined range of temperature is between 500 and 750 degrees F., and the predetermined amount of time is less than two hours.

BRIEF DESCRIPTION OF THE DRAWINGS

These and other more detailed and specific features of the present invention are more fully disclosed in the following specification, reference being had to the accompanying drawings, in which.

DETAILED DESCRIPTION OF THE INVENTION

Figure 1:
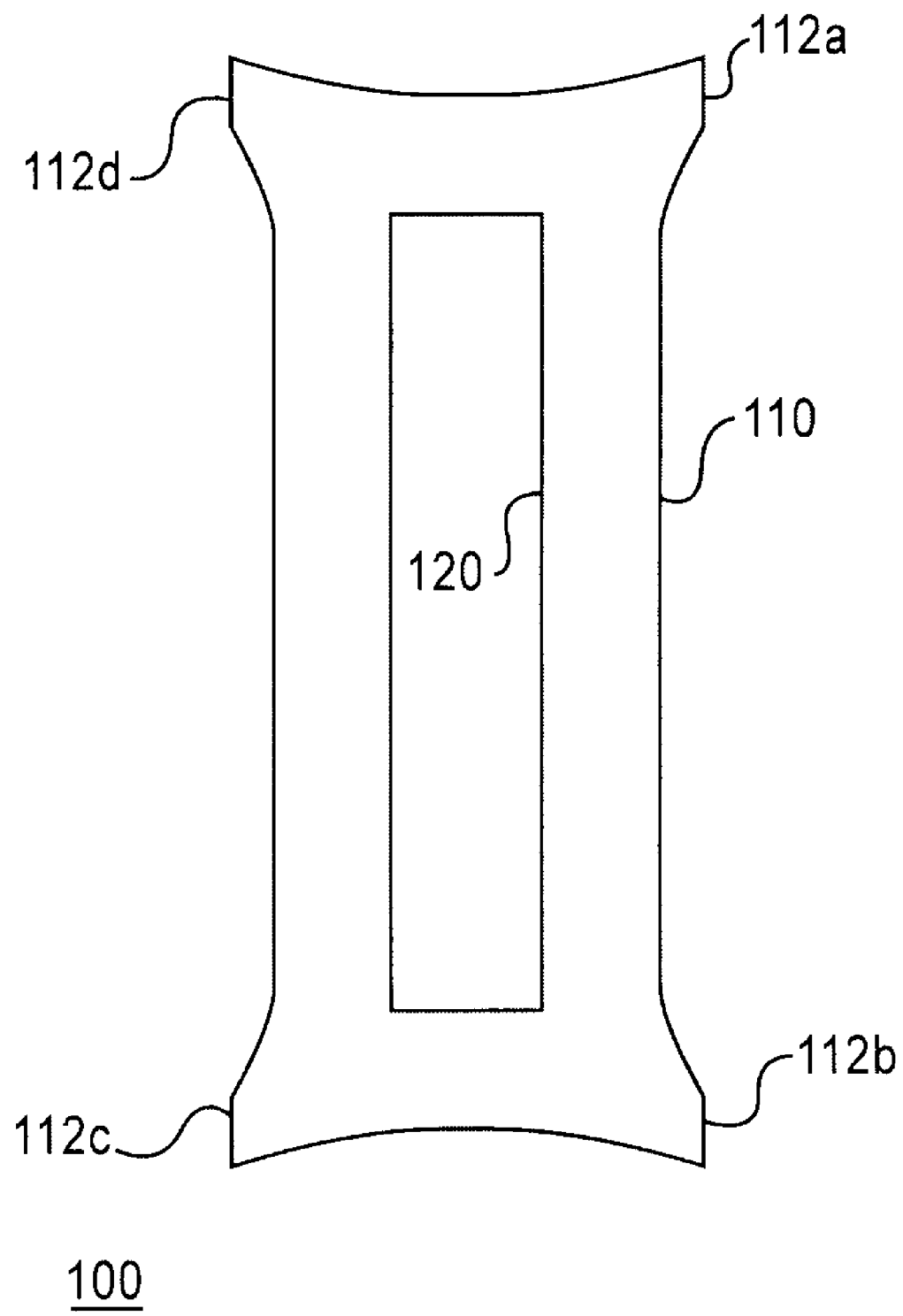
FIG. 1 illustrates an example of a photoplate pixel area on a photoplate.

In the following description, for purposes of explanation, numerous details are set forth, such as flowcharts and system configurations, in order to provide an understanding of one or more embodiments of the present invention. However, it is and will be apparent to one skilled in the art that these specific details are not required in order to practice the present invention.

According to one aspect, at least one embodiment of the present invention provides a photoplate structure useful in a two-sided etch to provide a unique aspect ratio pixel. The screen (which may also be referred to as a mask) is used in the vacuum evaporation, deposition, or chemical vapor deposition (CVD) process in the manufacturing of OLED displays. The corresponding artwork pattern design facilitates a very steep and narrow tie-bar between the pixels in the vertical direction and a large, sweeping bevel opening in the horizontal direction. This allows the close pattering of pixels needed for high definition displays while optimizing the chemical deposition onto a TFT backplane.

The internal patterning of the pixel allows the construction of a 3-dimensional pixel opening with varying aspect ratios in the horizontal and vertical directions. Additionally, the use of imaged "stripes" or halftone circles within the pixel area inhibits etching in specific areas until these specific patterns are undercut and fall off the substrate. At that point the entire pixel area is subjected to a similar etch rate but the depths are varying depending on the halftone pattern. Varying the size and spacing of the halftone pattern allows etching to be inhibited at different rates within the pixel allowing for a localized deeper etch needed to create steep vertical bevels.

A preferred material for the deposition mask is invar. Invar is a metal alloy that is cold rolled into long thin sheet in a steel mill. Invar cannot be electrodeposited onto a rotating mandrel as the nickel mask. A preferred and more cost feasible method for forming the open areas in the mask used for deposition is through a wet chemical etching.

Wet chemical etching is well known in the manufacturing of consumer electronics, ranging from circuit board manufacturing to the production of aperture grilles used in antiquated cathode ray tube televisions. Wet etching is used in a photolithographic process where a thin coating is applied to the surface of the invar. This coating is photosensitive to ultraviolet light radiation. Upon exposure the molecules in the coating combine, or cross-link, to form an insoluble coating.

Areas that are exposed will be resistant to chemical etching as opposed to unexposed areas. The unexposed areas are slowly dissolved to form appropriately sized holes. As the open areas form the corner detail of the hole begins to round. The presence of round corners reduces the overall area of light emitting organic material deposited on the substrate. This causes an undesirable reduction in the overall brightness of the display. Various embodiments describe herein obviate these problems.

FIG. 1 illustrates an example of a pixel etching area 100 according to one embodiment. A matrix of pixel etching areas 100 are preferably provided on photoplate material, such as quartz. The photoplate is used to expose an invar sheet pursuant to a process for creating a mask having corresponding pixel areas thereon. The photoplate has a negative image of the pixel area, with the pixel areas being formed on the mask via conventional application of photoresist, exposure, etc. The mask, in turn, is used to fabricate display panels having pixel circuitry and corresponding pixels thereon, also using conventional semiconductor processes, but producing pixel areas having the desirable geometries described herein.

In order to reduce the radius of the corner and to also maintain the long narrow geometry required for pixel formation, the pixel etching area 100 facilitates an increased etching in the corners while slowing etching on the top and bottom of the pixel. Elongated corners (112a-d) on the upper surface of the photoplate allow for the replenishment of liquid in this area, which with a ninety degree corner would otherwise be impeded. The fluting of the corners does not necessarily eliminate the radius of the corner in the formed pixel but drastically reduces the rounding effect.

In particular, the pixel etching area 100 includes an outer periphery 110 and an inner area 120. The surface extending between the outer periphery 110 and the inner area 120 is not transparent on the photoplate. During fabrication of the mask, the invar material is exposed in areas other than this surface. Accordingly, the initial etch pattern on the mask corresponds to this surface (between 120 and 110).

Preferably, the outer periphery 110 includes elongated corners 112a-d to accommodate close patterning in the vertical direction while also allowing robust chemical deposition in the horizontal direction. The elongation of the corners may depend on how close the pixels are placed in the vertical direction. For example, if the final specification is a 10 micrometer tie-bar, it may be desirable to space the pixels between 25 and 35 micrometers away from each other and use the additional space between to elongate the corners. Because the corners will never be square, it may be preferable to use whatever space is available, in this case 25-35 micrometers. Each corner elongation would thus be between 12 and 17 micrometers. It should be noted that the extent of elongation may actually extend up to half of the separation in the vertical direction, meaning that the corners of the vertically adjacent pixel etching areas on the photoplate may actually touch each other.

It should be noted that the space restrictions are much more significant in the vertical direction as compared to the horizontal direction. Therefore the elongation can be mirrored from the vertical to the horizontal. That is, if the extent of elongation (the tip of the elongated corner) is 10 micrometers in the vertical direction, it can also be arranged as 10 micrometers in the horizontal direction. To explain further what the extent of elongation refers to, 10 micrometers in the vertical direction means 10 micrometers beyond what it would have been if the pixel area was a strictly rectangular shape.

Slight modifications may also be implemented to further define the periphery to optimize pixel area formation. For example, slightly curved lines may define the portions of the outer periphery that approach the extent of elongation.

Figure 2:
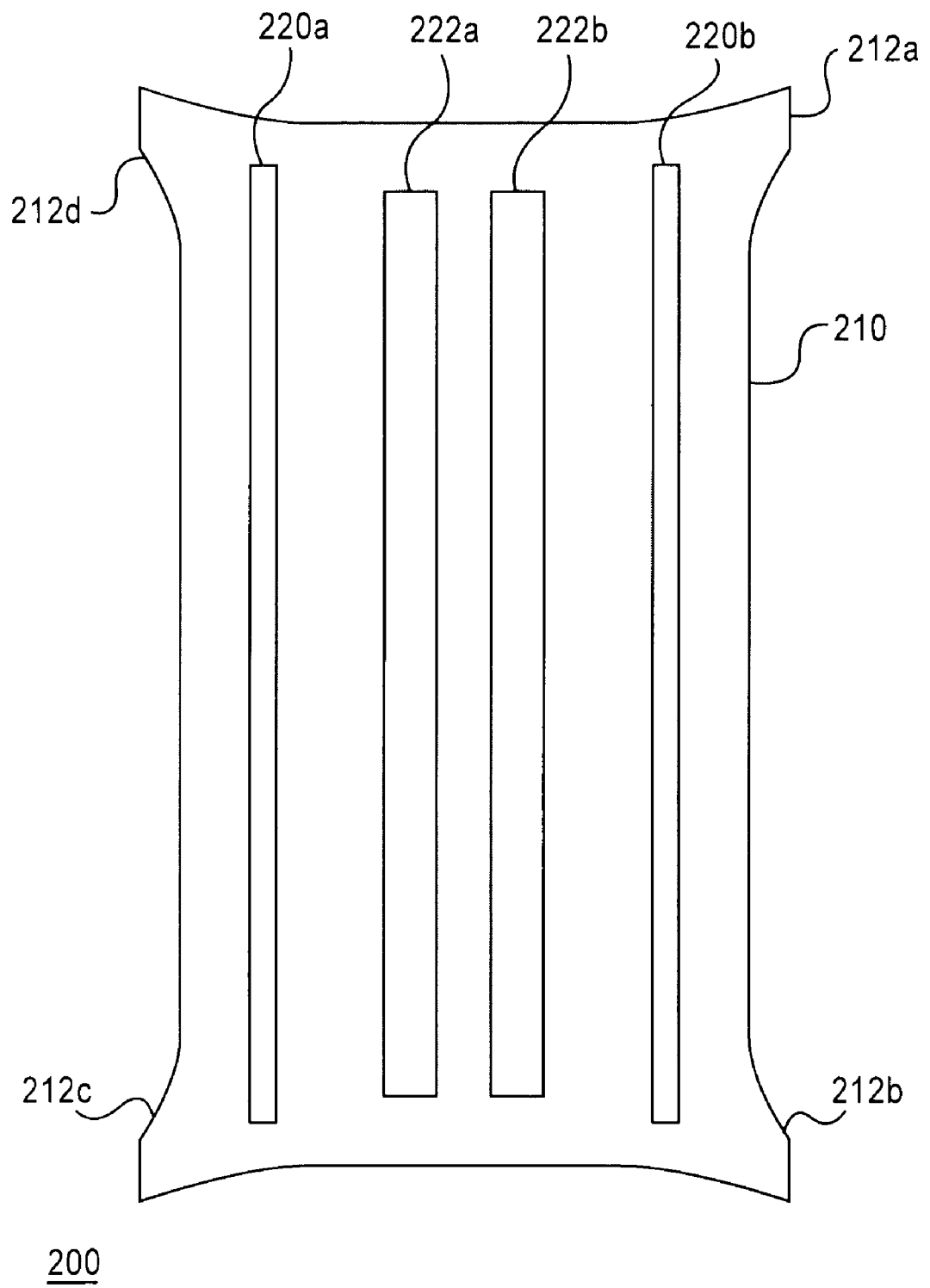
FIG. 2 illustrates another example of a photoplate pixel area on a photoplate.

FIG. 2 illustrates another example of a pixel etching area 200 according to another embodiment. This pixel etching area 200 similarly includes an outer periphery 210 that has elongated corners 212a-d. However, here the inner area of the pixel etching area 200 actually includes a plurality of narrow rectangular portions or stripes 220a-b, 222a-b.

This similarly allows close patterning in the vertical direction and an open bevel structure in the horizontal direction allowing for robust chemical deposition.

In addition, the internal patterning of the pixel allows the construction of a 3-dimensional pixel opening with varying aspect ratios in the horizontal and vertical directions. The use of imaged stripes or, alternatively, halftone circles within the pixel image inhibits etching in specific areas until these specific patterns are undercut and fall off the substrate. At that point the entire pixel is subjected to a similar etch rate but the depths are varying depending on the halftone pattern. By varying the size and spacing of the halftone pattern etching can be inhibited at different rates within the pixel allowing for a localized deeper etch needed to create steep vertical bevels.

Additionally, a first set of rectangular portions 220a-b may be configured to have a length and/or width differing from that of the second set of rectangular portions 222a-b. This allows the 3-dimensional contouring of the resultant pixel opening to be further controlled. It is noted that in addition to vertical stripes, horizontal stripes or halftone patterning may be used.

The dimensions of the vertical tie-bars are described further above. There may be a need for close horizontal patterning requiring narrow tie-bars in the horizontal direction. This is dictated by the TFT pattern on the substrate.

Although various designs may be implemented depending upon the application and the required design sizes and tolerances of the pixels, one preferred example for producing a pixel design is a two-sided wet etch process on an Invar-36 substrate of 50 microns.

Methods other than a chemical wet etch may also be provided. For example, a plasma etching may be used. Additionally, the aspect ratio of the pixel could potentially be improved by using material thinner than Invar-36 substrate material, but certain thicknesses may not be available in the widths required for production. Still further, the 50 micron material could be etched down to 25 microns prior to image patterning. The thinner the material the easier it will be to produce the desired pixel size with small tie bars and open deposition area.

The mask may then be used to fabricate pixel matrix on a substrate for use in a display panel. This may entail depositing organic material onto the substrate through the mask. Conventional front end and finishing steps may thus be used to fabricate an OLED display panel using the mask.

According to another aspect of the present invention, dimensional stabilization of the precision etched masks is provided.

As noted above, one way to make metal deposition masks is to chemically etch the holes. This requires several steps to be performed on the metal including cleaning, photo resist coating, imaging, photo resist developing, acid etching, back coat curing, and resist stripping. These steps cause the mask to be heated and cooled several times during the process. The mask also gets thermally cycled during the process of depositing the organic material onto the substrate.

To meet the requirement of precisely registering the organic material onto the substrate glass without smearing, there is a need for low thermal expansion material in the size and thicknesses required for the masks. Invar is a material with low thermal expansion, can be rolled to the proper dimensions, and can be chemically etched.

It has been determined that the invar material is not dimensionally stable during a typical mask making process. This is because the invar shrinks during each step that the material is heated, leaving the holes in the final part too close together. Of course, it should be expected that further instability from the thermal cycling of deposition will occur as well. The magnitude of such dimensional change is believed to be far beyond any reasonable tolerance for registration.

According to this aspect, the invar material is heated to relieve the internal stresses caused from the rolling of the material. This results in a dimensionally stable mask.

Figure 3:
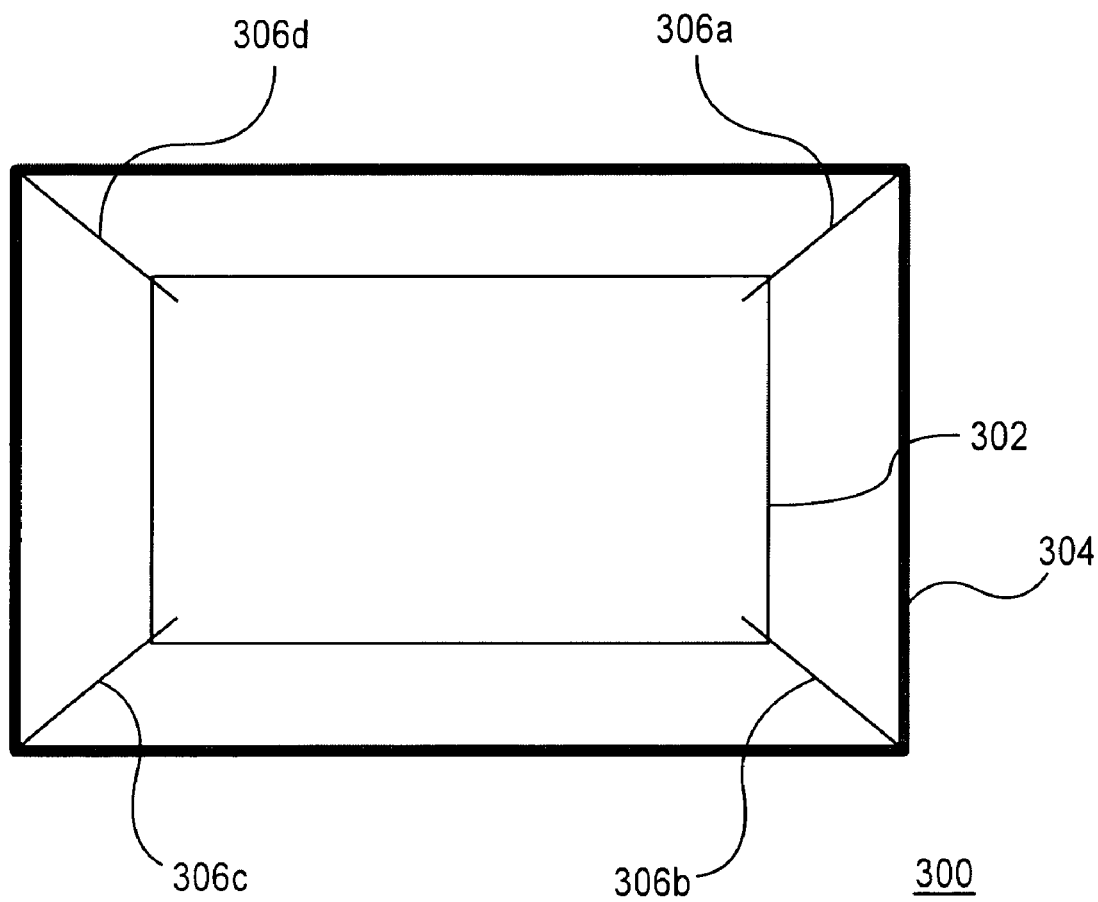
FIG. 3 illustrates an example of a frame for securing material during a process for dimensional stabilization of precision etched masks.

FIG. 3 is a schematic diagram illustrating an example of an apparatus 300 used in the dimensional stabilization procedure. An invar metal sheet 302 is held in a frame 304, preferably by springs 306a-d that allow expansion and contraction of the invar sheet without inducing kinks and creases. This frame is put into an oven and allowed to heat for a specific period of time (15 min-2 hours) depending on material quality and thickness. The frame may preferably be composed of stainless steel, but other suitable materials may be substituted.

The heating process may be performed as a one piece process in lieu of a roll-to-roll process. This allows for customized high precision applications, such as OLED, in contrast to high volume mass produced items.

Figure 4:
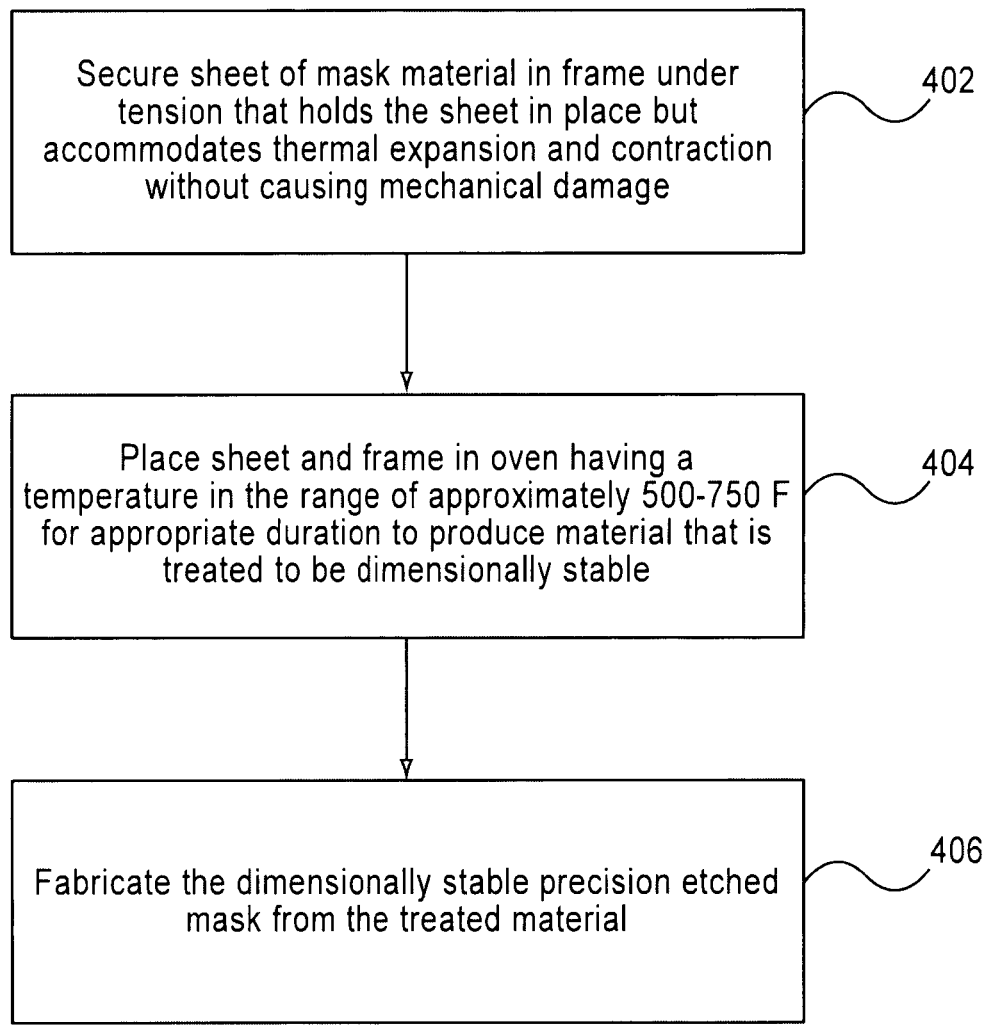
FIG. 4 illustrates an example of a process for dimensional stabilization of precision etched masks.

FIG. 4 illustrates a process 400 for preparing a dimensionally stable precision etched mask. Initially, the invar sheet is placed 402 in the frame, preferably under a tension that holds the sheet in place but which accommodates thermal expansion and contraction without causing mechanical damage: The sheet size is dependent on the final screen size. By way of example, a 27-inch OLED display may entail starting with a 800 mm×600 mm sheet of invar of approximately 50 microns in thickness. The starting sheet may also be cut down to customer specified dimensions.

Then, the sheet and frame are placed 404 vertically in a large oven having a temperature within the desired range. Multiple sheets, such as 3-10 at a time, may be concurrently placed in the oven if desired.

The sheet and frame are heated at a desired temperature for an appropriate duration. In one example, the oven temperature is approximately 670 degrees F. and the soak time may be as long as two hours. A range of approximately 500-750 degrees F. may be used to accommodate sufficiently positive results without incurring material damage. Also, heating for approximately two hours was observed to have been clearly sufficient for producing effective results without causing damage. A significantly shorter duration may be used to achieve similar results.

Once sheet of material has been treated in this fashion, the dimensionally stable precision etched mask may be fabricated 406 from the material. This may be performed by coating, exposing and etching the treated material using the photoplate and corresponding pixel area as described above. Alternatively, any conventional process for fabricating the mask may be implemented.

Thus embodiments of the present invention produce and provide dimensional stabilization of precision etched masks and a photoplate for an OLED deposition screen. Although the present invention has been described in considerable detail with reference to certain embodiments thereof, the invention may be variously embodied without departing from the spirit or scope of the invention. Therefore, the following claims should not be limited to the description of the embodiments contained herein in any way.

The invention claimed is:

1. A photoplate for manufacturing a deposition mask that is used to form a matrix of pixel areas used in a display panel, the photoplate comprising:
   a layer of photoplate material; and
   a plurality of pixel etching areas defined on the layer of photoplate material, the plurality of pixel etching areas being configured to form pixel areas having a specified separation between adjacent, sequential ones of the plurality of pixel etching areas extending in a vertical direction, said pixel etching areas including an outer periphery having a generally rectangular shape with elongated corners,
   wherein each elongated corner has an extent of elongation and extends from the outer periphery to terminate distally in an elongated corner end portion,
   wherein the extent of elongation from the outer periphery to the elongated corner end portion is approximately one half the specified separation in the vertical direction, wherein the extent of elongation from the outer periphery to the elongated corner end portion in the horizontal direction is approximately one half the specified separation and wherein respective ones of the elongated corner end portions of the adjacent, sequential ones of the plurality of pixel etching areas on the photoplate touch each other.

2. The photoplate according to claim 1, wherein the elongated corners accommodate an enhanced etch in the corner areas of formed pixels.

3. The photoplate according to claim 1, wherein the pixel etching areas include a plurality of rectangular areas defined within the outer periphery.

4. The photoplate according to claim 3, wherein a first set of the plurality of rectangular areas have a first area, and a second set of the plurality of rectangular areas have a second area that differs from the first area.

5. The photoplate according to claim 3, wherein a subset of the plurality of rectangular areas resident closer to the outer periphery are configured to be larger than another subset of the plurality of rectangular areas, thereby accommodating an enhanced etch along the sides of formed pixels.

* * * * *